United States Patent [19]

Tsutsumi

[11] Patent Number: 4,939,488
[45] Date of Patent: Jul. 3, 1990

[54] MAGNETOSTATIC WAVE DEVICE

[75] Inventor: Makoto Tsutsumi, Hirakata, Japan

[73] Assignee: Murata Manufacturing Co., Ltd., Kyoto, Japan

[21] Appl. No.: 189,557

[22] Filed: May 3, 1988

[30] Foreign Application Priority Data

May 6, 1987 [JP] Japan .................................. 62-110038

[51] Int. Cl.⁵ .............................................. H01P 1/20
[52] U.S. Cl. .................................. 333/202; 333/219.2
[58] Field of Search ............... 333/219, 235, 246, 202, 333/204, 205, 201, 24.1, 219.2

[56] References Cited

U.S. PATENT DOCUMENTS

| | | | |
|---|---|---|---|
| 3,593,216 | 7/1971 | Buck | 333/24.1 |
| 4,034,313 | 7/1977 | Jones et al. | 333/24.1 |
| 4,122,418 | 10/1978 | Nagao | 333/24.1 X |
| 4,565,984 | 1/1986 | Castera et al. | 333/246 |
| 4,743,874 | 5/1988 | Kinoshita et al. | 333/235 X |
| 4,777,462 | 10/1988 | Kunz et al. | 333/219 |

*Primary Examiner*—Eugene R. Laroche
*Assistant Examiner*—Seung Ham
*Attorney, Agent, or Firm*—Jordan and Hamburg

[57] ABSTRACT

A magnetostatic wave device includes a ferrimagnetic base such as an YIG (yttrium, iron, garnet) thin film. This ferrimagnetic base is formed, for example, on a GGG (gadolinium, gallium, garnet) substrate. Furthermore, a disk-form conductor is formed on the YIG thin film. This conductor is formed by adhering, for example, copper foil to the YIG thin film or by adhering a conductive material such as silver to the YIG thin film surface by means of evaporating or sputtering method.

7 Claims, 5 Drawing Sheets

MAGNETOSTATIC WAVE DEVICE

BACKGROUND OF THE INVENTION

1. Technical Field of The Invention

This invention relates to a magnetostatic wave device and, more particularly, to the same device which includes a ferrimagnetic base such as an YIG (yttrium, iron, garnet) thin film and, is used, for example, for a filter or an oscillator resonator with application of direct current magnetic field to the ferrimagnetic base in the direction perpendicular to its surface.

2. Description of The Prior Arts

One example of conventional surface magnetostatic wave devices which constitutes a background of this invention is disclosed in Japanese Patent Provisional Publication No. 143819/1980.

FIG. 7 is a perspective view showing one example of such conventional magnetostatic wave devices. This conventional magnetostatic wave device 1 includes an YIG thin film 2. The YIG thin film 2 is formed on one main surface of a GGG (gadolinium, gallium, garnet) substrate 3. Furthermore, an input antenna 4 and an output antenna 5 are provided on the YIG thin film 2 and they are spaced apart. Each one end of these antennas 4 and 5 is grounded and each other end of them is connected to an input terminal 6 and an output terminal 7 respectively.

Such a magnetostatic wave device is used under the condition which a direct current magnetic field is applied to the YIG thin film surface in the direction perpendicular to its surface. When this magnetostatic wave device is used as a resonator, a resonance frequency of the resonator may be varied by varying the direct current magnetic field intensity.

However, such a conventional magnetostatic wave device has bad selectivity at a resonance frequency and large insertion loss, that is, a small Q-value. In addition, the conventional magnetostatic wave device has also bad spurious mode separation.

SUMMARY OF THE INVENTION

Therefore, the principal object of the present invention is to provide a magnetostatic wave device which has a large Q-value at a resonance frequency and good spurious mode separation.

This invention is providing a magnetostatic wave device which includes a ferrimagnetic base and a conductor formed on the ferrimagnetic base surface.

According to the present invention, a magnetostatic wave device which has a large Q-value at a resonance frequency and good spurious mode separation is obtained.

These objects and other objects, features, aspects and advantages of the invention will become more apparent from the detailed description of the following embodiments when taken in conjunction with the accompanying drawings.

DESCRIPTION OF THE PREFERRED EMBODIMENTS

Figure 1:
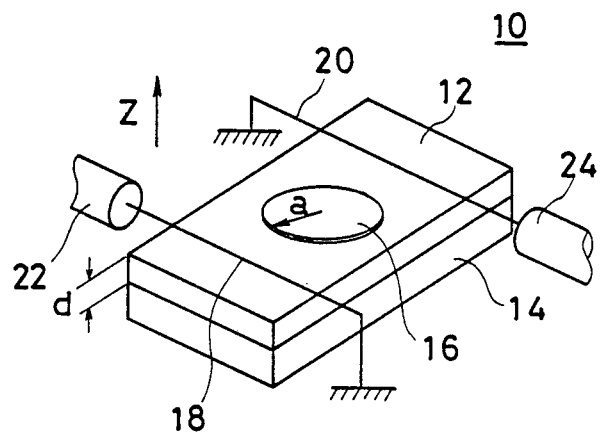
FIG. 1 is a perspective view showing one embodiment of the invention.

FIG. 1 is a perspective view showing one embodiment of the invention. This magnetostatic wave device 10 includes an an YIG (yttrium, iron, garnet) thin film 12 as a ferrimagnetic base. The YIG thin film 12 is formed, for example, in 11 mm length, 9.8 mm width and 13.6 $\mu$m thickness on one main surface of a GGG (gadolinium, gallium, garnet) substrate 14 having 500 $\mu$m thickness.

A disk-shaped conductor 16 is formed, for example, in 6 mm diameter, 100 $\mu$m thickness on the center of the YIG thin film 12 surface. This conductor 16 is formed by adhering, for example, copper foil to the YIG thin film 12 surface. However, it is better to form the conductor 16 by adhering a conducting material such as silver to the YIG thin film 12 surface by means of evaporating or sputtering method.

Furthermore, a linear input antenna 18 and a linear output antenna 20 are formed on the YIG thin film 12 surface and they are spaced, for example, 8.2 mm apart in the longitudinal direction of the YIG thin film 12. Each one end of these antennas 18 and 20 is grounded and each other end of them is connected to the input terminal 22 and output terminal 24 respectively.

The magnetostatic wave device 10 is exposed to a direct current magnetic field perpendicular to the YIG thin film 12 surface (direction indicated with an arrow Z in FIG. 1) when the device is used.

Figure 7:
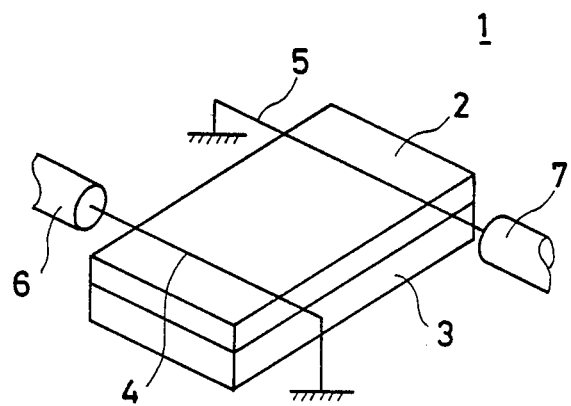
FIG. 7 is a perspective view showing one example of the conventional magnetostatic devices constituting a background of the invention.
Figure 8:
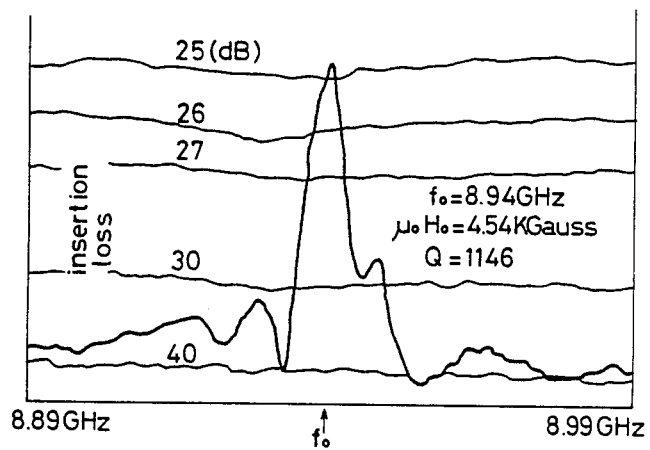
FIG. 8 is a frequency characteristic curve of the conventional device of FIG. 7.

The magnetostatic wave device 10 has superior resonance characteristics such as a larger Q-value at a resonance frequency and good spurious mode separation as compared with the conventional type of FIG. 7 which has an YIG thin film of the same dimensions and the same form as that of this embodiment and has no conductor on the YIG thin film.

According to the inventor's experiments, the conventional type of FIG. 7 has a Q-value of 1,146 at the resonance frequency of 8.94 GHz and a spurious level of 7 dB, while the device of this embodiment has a Q-value of 1,500 at the resonance frequency of 9 GHz and a spurious level of 20 dB.

In the magnetostatic wave device 10 of this embodiment, the resonance frequency is close to the magnetic resonance frequency (uniform precession mode frequency) and Q-value is almost not affected by conductor loss due to conductor 16.

Then, the fact that the resonance frequency is close to the magnetic resonance frequency when the conductor is formed on the YIG thin film surface and the conductor loss due to the conductor has almost no effect on the Q-value is theoretically explained as follows.

As shown in FIG. 1, in the magnetostatic wave device 10 having the conductor 16 with a radius a on the surface of the YIG thin film 12 with a thickness d, the resonance frequency and the Q-value of the device 10 are analyzed by using a cylindrical coordinate system when the device is exposed to a direct current magnetic field $\mu_o H_o$ perpendicular to the YIG thin film 12 surface (direction indicated with the arrow Z in FIG. 1).

(i) Resonance frequency of the magnetostatic wave device

When the Maxwell's equation is solved using the magnetostatic approximation, a following wave equation (1) is obtained which relates to a magnetostatic potential $\phi$ in the YIG thin film of the device.

$$\mu \left( \frac{\partial^2 \phi}{\partial r^2} + \frac{1}{r}\frac{\partial \phi}{\partial r} + \frac{1}{r^2}\frac{\partial^2 \phi}{\partial \theta} \right) + \frac{\partial^2 \phi}{\partial z^2} = 0 \quad (1)$$

In the equation (1), $\mu$ is a diagonal element of permeability tensor of the YIG thin film and is expressed by the following equation (2).

$$\mu = 1 + \frac{\gamma\mu_o H_o \cdot \gamma\mu_o M}{(\gamma\mu_o H_o)^2 - \omega^2} \quad (2)$$

where $\gamma$ is a gyromagnetic ratio, $\mu_o M$ represents saturated magnetization of the YIG thin film, and $\mu_o H_o$ is an internal direct current magnetic field.

When the above wave equation (1) is solved by using boundary condition at $Z=0$ and $Z=d$, the magnetostatic potential $\phi$ in the YIG thin film is expressed in the m-order Bessel function as shown in a next equation (3).

$$\phi = A J_m(k_c r) e^{-jm\theta} \cos(n\pi Z/d) \quad (3)$$

where n is an integer not containing 0, and $k_c$ is expressed in the following equation (4).

$$k_c = \frac{1}{\sqrt{-\mu}} \frac{n}{d} \pi \quad (4)$$

Furthermore, when assuming a magnetic wall at $r=a$ as a boundary condition, $H_\theta=0$ results and a following expression (5) is obtained.

$$J_m'(k_c a) = 0 \quad (5)$$

When nth zero point of $J_m'(k_c r)$ of the m-order Bessel function is denoted with $Y_{m\bar{n}}$ the resonant frequency $f_o$ of the magnetostatic wave device is obtained from a following equation (6) that is derived from expressions (2) and (4).

$$f_o = \frac{1}{2\pi} \sqrt{\frac{\omega_h^2 + \left(\frac{dY_{m\bar{n}}}{n\pi a}\right)^2 \omega_o^2}{1 + \left(\frac{dY_{m\bar{n}}}{n\pi a}\right)^2}} \quad (6)$$

where $\omega_h = \gamma\mu_o H_o,$ $\omega_o = \sqrt{\omega_h(\omega_h + \omega_M)},$ $\omega_M = \gamma\mu_o M$ When the magnetic field $\mu_o H_o$ *is selected, for example, to be* 3.5 K Gauss and $f_o$ of expression (6) is numerically evaluated as a function of a/d, it becomes clear that resonance modes ($\bar{n}$, m, n) in the r, $\theta$, Z direction of the magnetostatic wave device appear separately and a magnetostatic standing wave generates and a magnetostatic wave energy is shut into the conductor under the condition of a/d<20.

However, when a/d≧20, resonance mode ($\bar{n}$, m, n) curves approach one another and no mode separation may be found and thus $f_o$ is approximated by the next expression (7).

$$f_o \approx \omega_h/2\pi = \gamma\mu_o H_o/2\pi \quad (7)$$

Considering the magnetostatic wave device 10 of the embodiment of FIG. 1, thickness d of the YIG thin film 12 is 13.6 $\mu$m and sufficiently smaller compared with the radius a (3 mm) of the conductor 16, therefore it is theoretically understood that the resonance frequency $f_o$ is approximated by expression (7) and becomes equal to the magnetic resonance frequency.

(ii) Q-value of the magnetostatic wave device $Q_L$-value of the magnetostatic wave device which originates from the conductor loss due to the conductor on the YIG thin film is expressed with a next expression (8).

$$Q_L = \omega U / W_L \quad (8)$$

In the expression (8), $\omega$ denotes a resonant angular frequency and U is stored energy of the magnetostatic wave device and is expressed with a next expression (9).

$$U = \int_v \frac{1}{2} \frac{\partial \omega \bar{\mu}}{\partial \omega} H \cdot H^* dv \quad (9)$$

where $W_L$ is the lost energy during one second and is considered to be caused by the current passing through the disk-form conductor, then it is expressed by a next expression (10).

$$W_L = \frac{1}{2} R_s \int_s |H_t|^2 ds \quad (10)$$

where $R_s$ is a skin resistance, $H_t$ is a magnetic field at $Z=d$.

When $Q_L$ of the magnetostatic wave device which originates from conductor loss due to the conductor is calculated by expression (8), $Q_L$ becomes $5 \times 10^{11}$ in the magnetic field $\mu_o H_o$ of 3 K Gauss and $2 \times 10^{12}$ in the $\mu_o H_o$ of 7 K Gauss.

Furthermore, in the magnetostatic wave device, magnetic loss exists in the YIG thin film and $Q_M$ originating from this loss becomes 3,000 in the magnetic field $\mu_o H_o$ of 3 K Gauss and 7,000 in the $\mu_o H_o$ of 7 K Gauss.

As described above, $Q_M$ is very small as compared with $Q_L$ originating from the conductor loss, therefore Q-value of the magnetostatic wave device is expressed by a next equation (11).

$$\frac{1}{Q} = \frac{1}{Q_L} + \frac{1}{Q_M} \approx \frac{1}{Q_M} \quad (11)$$

From equation (11), it is theoretically understood that $Q_L$ originating from the conductor has almost no effect on the Q-value of the magnetostatic wave device.

Figure 2:
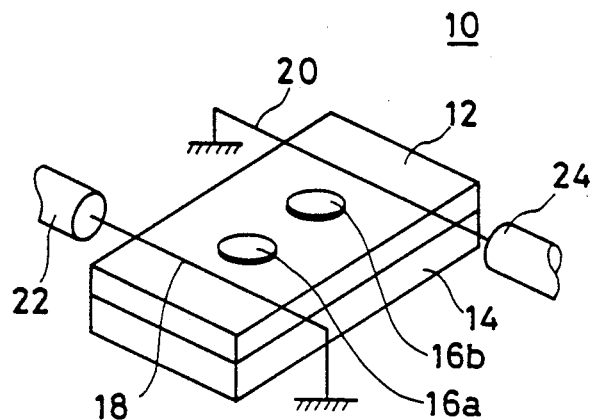
FIG. 2 is a perspective view showing another embodiment of the invention.

FIG. 2 is a perspective view showing another embodiment of the invention. In this embodiment, two disk-form conductors 16a and 16b each having, for example, a radius a (1.5 mm) are provided on the YIG thin film 12 and they are spaced apart in a longitudinal direction of the YIG thin film 12.

Figure 3:
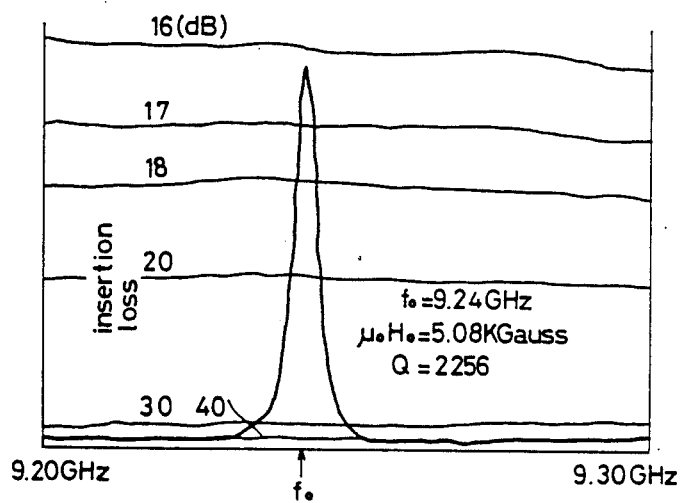
FIG. 3 is a frequency characteristic curve of the embodiment of FIG. 2.

The frequency characteristic of the magnetostatic wave device 10 of the embodiment is shown in FIG. 3. The Q-value at the resonance frequency of 9.24 GHz is 2,256 and the spurious level is 24 dB. The improvement of the resonance characteristic is clearly seen. Thus, if the number of the conductor disk is increased, the Q-value and the spurious level are increased accordingly.

Figure 4:
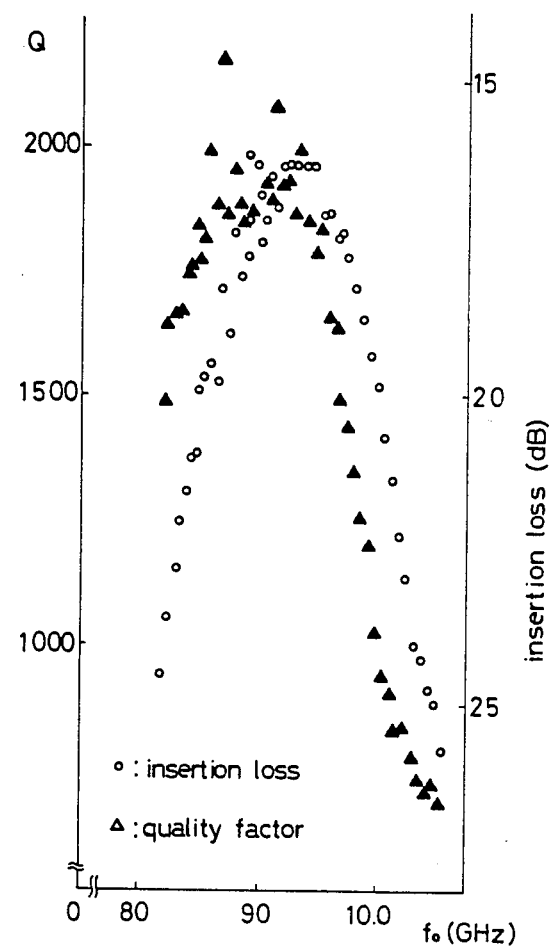
FIG. 4 is a graph showing relationship between frequency, Q-value and insertion loss of the embodiment of FIG.2.

Frequency characteristics of the Q-value and the insertion loss were measured on the magnetostatic wave device 10 of FIG. 2, and the measurement data are shown in FIG. 4. These data show that the magnetostatic wave device 10 of FIG. 2 has superior resonance characteristics such as the Q-value more than 2,000 at the vicinity of 9 GHz covering about 1 GHz band and insertion loss variation less than 3 dB.

Figure 5:
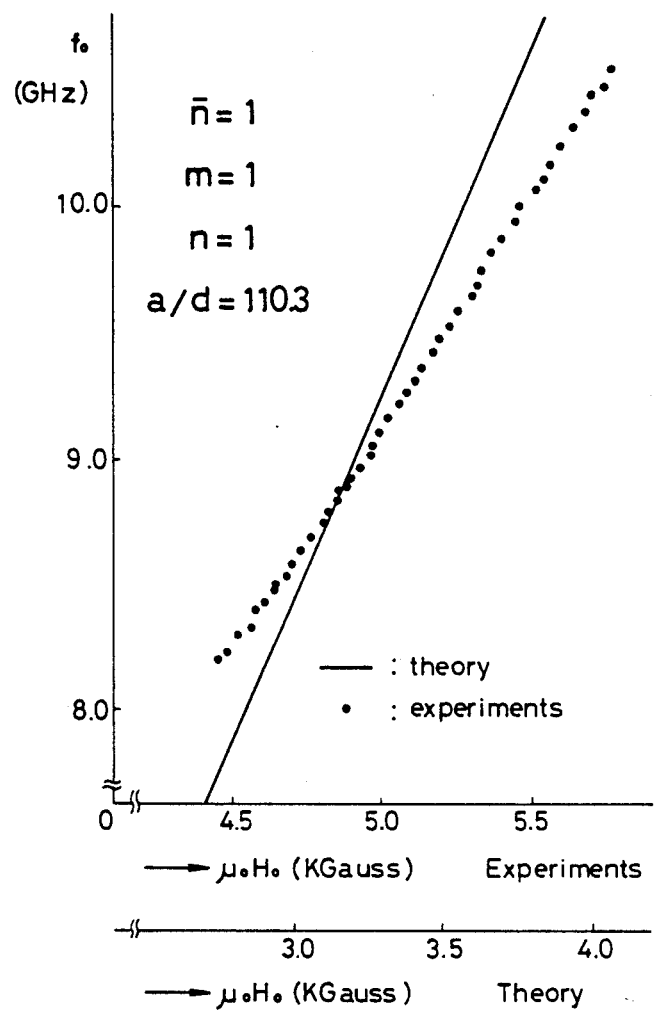
FIG. 5 is a graph showing resonance frequency dependence on magnetic fields for the embodiment of FIG. 2.

Meanwhile, regarding the resonance frequency $f_o$ dependence on magnetic fields, experimental value and theoretical values obtained from expression (6) for the magnetostatic wave device 10 of FIG. 2 are shown in FIG. 5. As can be seen from the data of FIG. 5, the theoretical values are not quite equal to the experimental values, but the resonance frequency $f_o$ satisfies the above equation (7) to be in proportion to the magnetic field $\mu_o H_o$. Difference of 1.7 K Gauss between the theoretical and experimental magnetic fields $\mu_o H_o$ on abscissa as in FIG. 5 is caused by demagnetization effect. Difference between the theoretical and experimental resonance frequency $f_o$ is principally caused by neglecting in the theoretical calculations the thickness of GGG substrate 14 which is integrated with YIG thin film 12.

The experimental results shown in FIG. 3 being caused by using disk conductors, it may be presumed that the resonance characteristic of the magnetostatic wave device 10 of FIG. 2 is caused by shutting up magnetostatic wave energy into the conductors 16.

Figure 6:
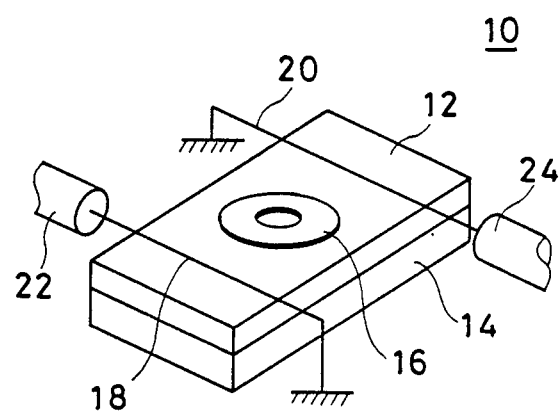
FIG. 6 is a perspective view showing a modification of the embodiment of FIG. 1.

FIG. 6 is a perspective view showing a modification of the embodiment of FIG. 1. In this embodiment, the conductor 16 is especially formed in a ring compared with the embodiment of FIG. 1. This ring formation of the conductor 16 allows a fundamental mode resonance frequency not to change much and permits higher order mode resonance frequencies to go high as compared with the embodiment of FIG. 1, making it possible to suppress spurious modes.

In the above-mentioned embodiments, the conductor is formed in a disk or a ring, but the conductor dimensions, forms and thickness may be modified in any suitable manner. These modification in the dimensions, forms and thickness may provide further improvement of characteristics.

It will be apparent from the foregoing that, while particular forms of the invention have been illustrated and described, they are used only for illustrations and examples, and the invention is not limited to these disclosures. The spirit and the scope of the invention are limited only by the appended claims.

What is claimed is:

1. A magnetostatic wave device comprising:
   a ferrimagnetic base,
   a conductor formed on a surface of said ferrimagnetic base, and
   an input antenna and an output antenna formed on said ferrimagnetic base and connected respectively to an input terminal and an output terminal, said input antenna and said output antenna each being spaced from said conductor and each being magnetostatically coupled with said conductor only through said ferrimagnetic base.

2. A magnetostatic wave device according to claim 1, wherein said conductor is in the shape of a disk.

3. A magnetostatic wave device according to claim 1, wherein said conductor is in the shape of a ring.

4. A magnetostatic wave device according to any one of claims 1 through 3, wherein a plurality of said conductors are formed on said ferrimagnetic base and are spaced apart on said ferrimagnetic base, each said conductor being spaced from said input antenna and said output antenna and being coupled with said input antenna and said output antenna only through said ferrimagnetic base.

5. A magnetostatic wave device according to claim 1, wherein said input antenna and said output antenna are formed on said ferrimagnetic base in spaced relation, and said conductor is formed on said surface of said ferrimagnetic base between said input antenna and said output antenna.

6. A magnetostatic wave device according to claim 1, wherein said conductor is made from a non-magnetic material.

7. A magnetostatic wave device according to claim 1, wherein said ferrimagnetic base is made from YIG.

* * * * *